(12) United States Patent
Hsien et al.

(10) Patent No.: US 11,477,910 B2
(45) Date of Patent: Oct. 18, 2022

(54) CENTRIFUGAL FAN (71) Applicants: INVENTEC (PUDONG) TECHNOLOGY CORPORATION, Shanghai (CN); INVENTEC CORPORATION, Taipei (TW)

(72) Inventors: Shin-Hsin Hsien, Taipei (TW); Chih-Kai Yang, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 413 days.

(21) Appl. No.: 16/694,953

(22) Filed: Nov. 25, 2019

(65) Prior Publication Data

US 2021/0084792 A1 Mar. 18, 2021

(30) Foreign Application Priority Data

Sep. 12, 2019 (CN) .......................... 201910863207.4

(51) Int. Cl.
| | | |
|---|---|---|
| *F01D 25/08* | (2006.01) | |
| *H05K 7/20* | (2006.01) | |
| *H01L 23/467* | (2006.01) | |
| *F04D 29/42* | (2006.01) | |
| *G06F 1/20* | (2006.01) | |
| *H01L 23/367* | (2006.01) | |
| *F28F 3/02* | (2006.01) | |

(52) U.S. Cl.
CPC ..... *H05K 7/20136* (2013.01); *F04D 29/4226* (2013.01); *H01L 23/467* (2013.01); *F28F 3/025* (2013.01); *G06F 1/203* (2013.01); *H01L 23/3672* (2013.01)

(58) Field of Classification Search
CPC .. G06F 1/203; F28D 15/0275; F04D 29/4226; H05K 7/20172
USPC .......................................................... 415/177
See application file for complete search history.

(56) References Cited

U.S. PATENT DOCUMENTS

| | | | | |
|---|---|---|---|---|
| 4,917,572 | A * | 4/1990 | Van Houten | F04D 17/16 415/206 |
| 7,381,027 | B2 * | 6/2008 | Kaneko | F04D 29/282 416/185 |
| 9,039,360 | B2 * | 5/2015 | Fukuda | F04D 29/4226 415/204 |
| 2009/0067991 | A1 * | 3/2009 | Hwang | F04D 25/0613 415/203 |
| 2014/0127022 | A1 * | 5/2014 | Cheng | F04D 29/281 416/192 |
| 2014/0290918 | A1 * | 10/2014 | Chen | F28D 15/0275 165/104.26 |

* cited by examiner

*Primary Examiner* — Long T Tran
*Assistant Examiner* — James J Kim
(74) *Attorney, Agent, or Firm* — Maschoff Brennan (57) ABSTRACT

A centrifugal fan including an impeller housing and an impeller. The impeller housing has an accommodation space, an air inlet and an air outlet. The air inlet and the air outlet are connected to the accommodation space. The impeller is located in the accommodation space. The impeller includes a hub, a plurality of blades, and at least one heat conductive annular portion. The hub is rotatably disposed in the impeller housing. The plurality of blades are connected to an outer circumferential surface of the hub. The at least one heat conductive annular portion is connected to the plurality of blades.

7 Claims, 9 Drawing Sheets

CENTRIFUGAL FAN

CROSS-REFERENCE TO RELATED APPLICATIONS

This non-provisional application claims priority under 35 U.S.C. § 119(a) on Patent Application No(s). 201910863207.4 filed in China, on Sep. 12, 2019, the entire contents of which are hereby incorporated by reference.

BACKGROUND OF THE INVENTION

Technical Field of the Invention

The invention relates to a fan, more particularly to a centrifugal fan.

Description of the Related Art

With the usage habit for the computers changes, laptop computers have become more and more popular. The reason for the laptop computer to become popular is that the laptop computer is lightweight, small, and easy to carry. Therefore, it is convenient to carry the laptop computer to commute or bring it to office or café for work, article viewing, clips watching or playing games. Some laptop computers are equipped with high end processors to improve gaming experience.

SUMMARY OF THE INVENTION

One embodiment of this invention provides a centrifugal fan including an impeller housing and an impeller. The impeller housing has an accommodation space, an air inlet and an air outlet. The air inlet and the air outlet are connected to the accommodation space. The impeller is located in the accommodation space. The impeller includes a hub, a plurality of blades, and at least one heat conductive annular portion. The hub is rotatably disposed in the impeller housing. The plurality of blades are connected to an outer circumferential surface of the hub. The at least one heat conductive annular portion is connected to the plurality of blades.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
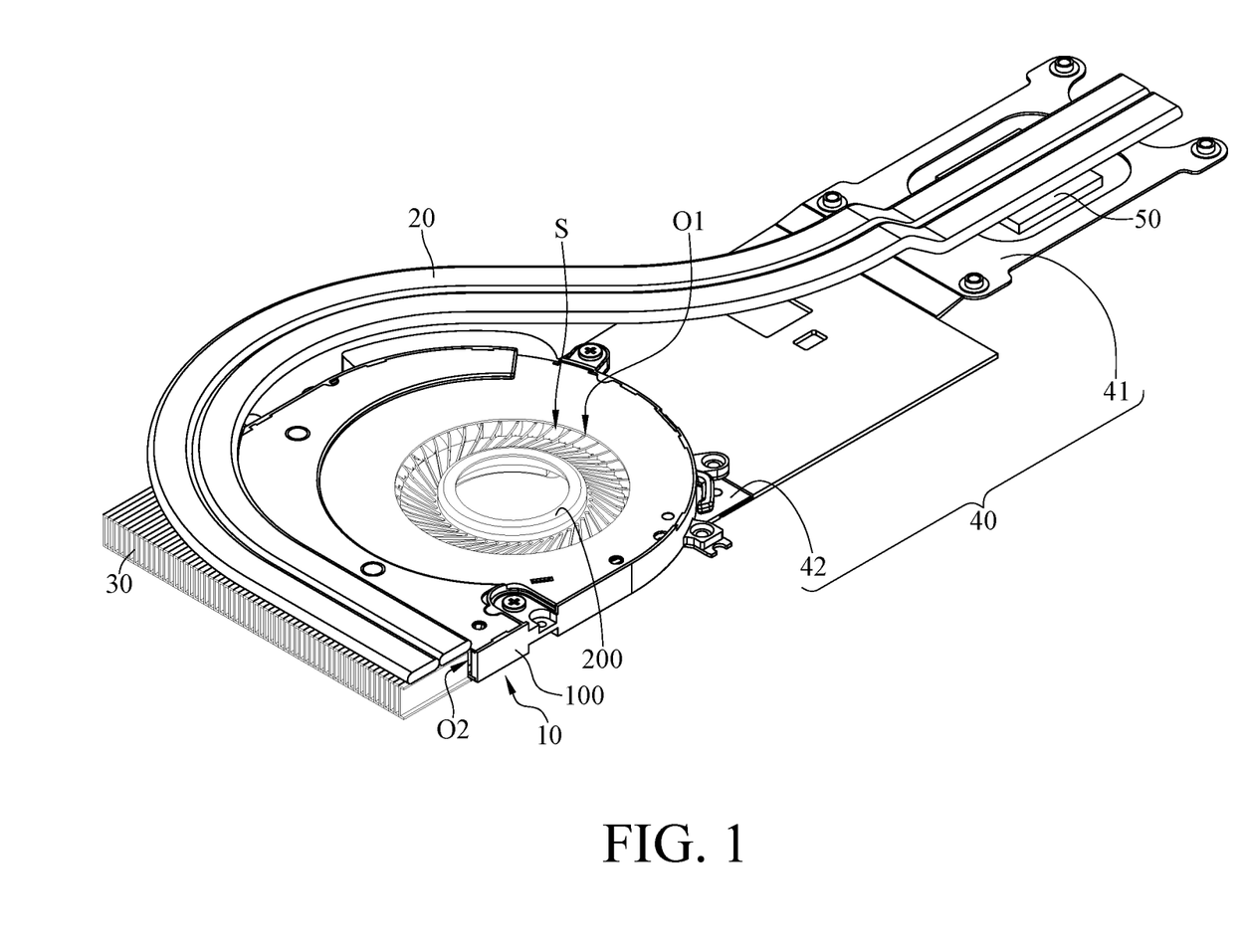
FIG. 1 is a perspective view showing a centrifugal fan according to a first embodiment of the invention, a heat pipe, a heat exchanger, and a mounting component.
Figure 2:
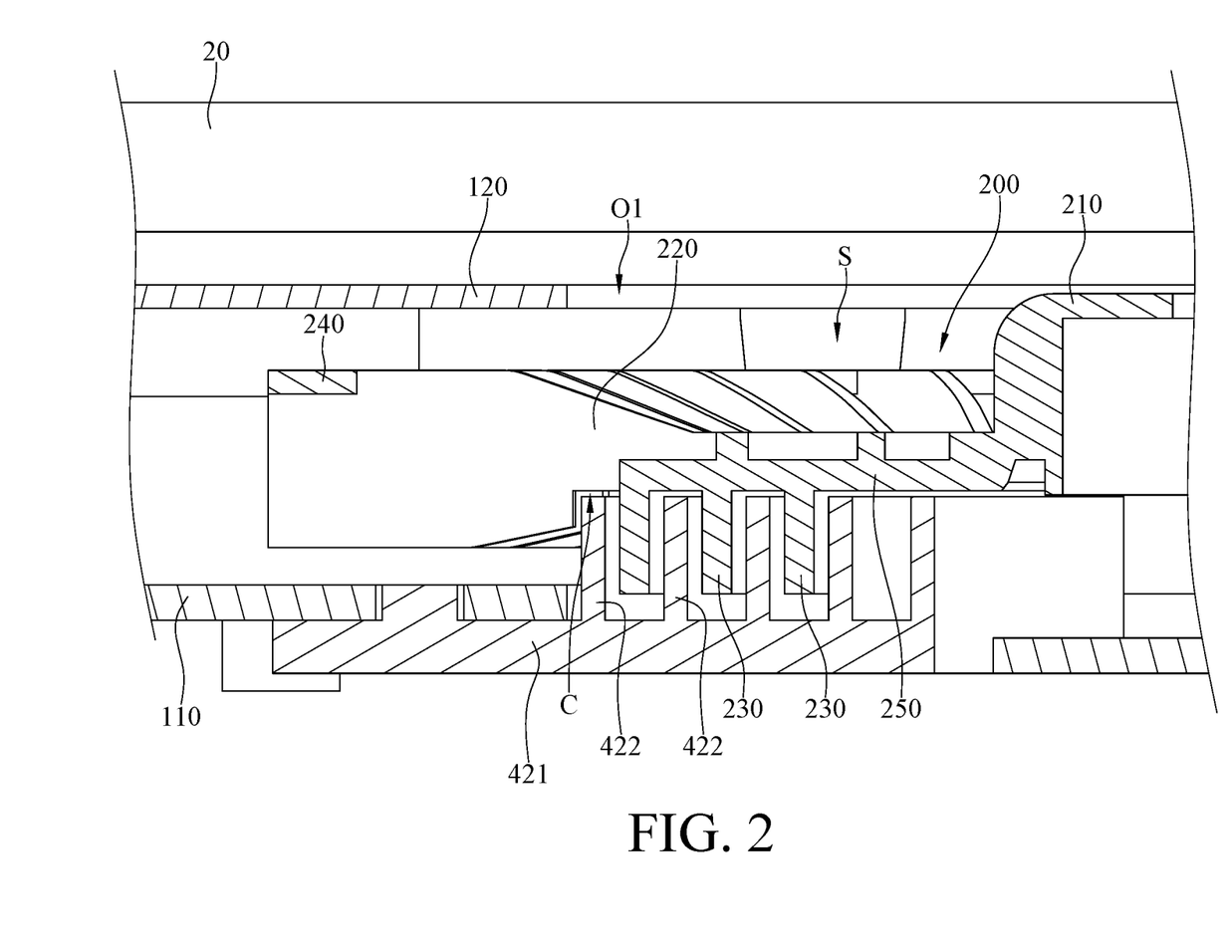
FIG. 2 is a partially enlarged cross-sectional view of the centrifugal fan, the heat pipe and the mounting component in FIG. 1.
Figure 3:
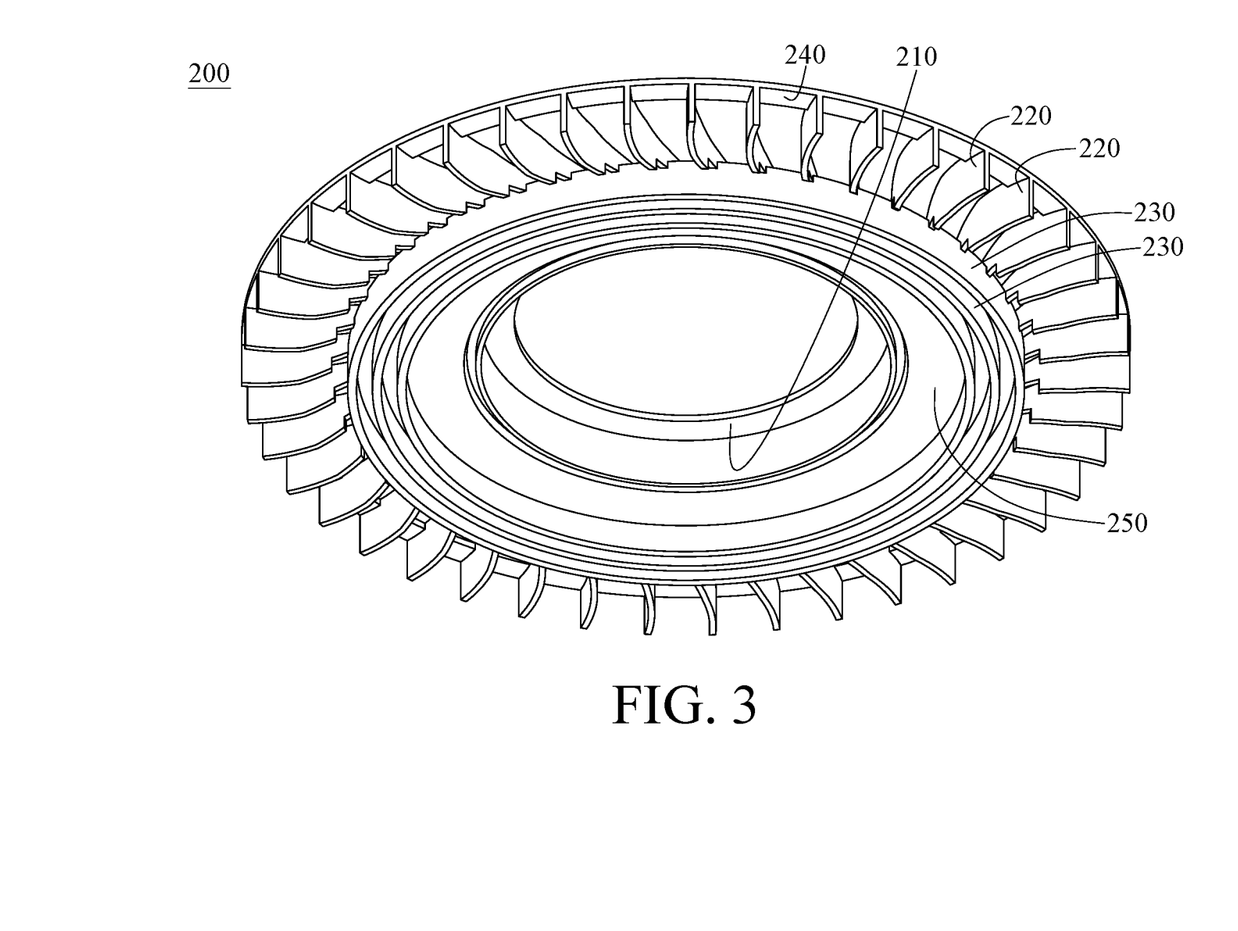
FIG. 3 is a perspective view of an impeller of the centrifugal fan in FIG. 1.

Please refer to FIG. 1 to FIG. 3, where FIG. 1 is a perspective view showing a centrifugal fan 10 according to a first embodiment of the invention, a heat pipe 20, a heat exchanger 30 and a mounting component 40, FIG. 2 is a partially enlarged cross-sectional view of the centrifugal fan 10, the heat pipe 20 and the mounting component 40 in FIG. 1, and FIG. 3 is a perspective view of an impeller 200 of the centrifugal fan 10 in FIG. 1.

In this embodiment, the centrifugal fan 10, the heat pipe 20, the heat exchanger 30 and the mounting component 40 may together form a heat dissipation system adapted to be thermally coupled to a heat source 50. The heat source 50 is, for example, a central processing unit or a graphic processing unit that can generate a large amount of heat during operation. The heat pipe 20 is thermally coupled to the heat source 50. The heat exchanger 30 is, for example, a heat sink, and the heat exchanger 30 is located at an air outlet O2 of the centrifugal fan 10 and is thermally coupled to the heat pipe 20, such that the heat generated by the heat source 50 can be transferred to the heat exchanger 30 via the heat pipe 20. The centrifugal fan 10 is able to produce airflow to take the heat accumulated in the heat exchanger 30 away. The mounting component 40 includes a heat absorbing part 41 and a heat dissipation part 42. The heat source 50 is configured to be mounted on the heat absorbing part 41, and the heat absorbing part 41 is thermally coupled to the heat source 50. The centrifugal fan 10 includes an impeller housing 100 and has an accommodation space S. The impeller housing 100 is disposed on the heat dissipation part 42, and the heat dissipation part 42 is partially located inside the accommodation space S. The heat dissipation part 42 is thermally coupled to the heat absorbing part 41. In such an arrangement, the heat generated by the heat source 50 is not only transferred to the heat exchanger 30 via the heat pipe 20, but also transferred to the heat dissipation part 42 via the heat absorbing part 41, and heat accumulated in the heat dissipation part 42 can be taken away by the airflow produced by the centrifugal fan 10 as well. That is, in addition to the heat dissipation approach of the heat source 50 via the heat pipe 20, the mounting component 40 provides an additional heat dissipation approach to aid heat dissipation. As such, the heat dissipation system including the centrifugal fan 10 of the embodiment has an improved heat dissipation capability.

In addition, the heat dissipation part 42 includes a base plate portion 421 and a plurality of heat conductive annular portions 422. The heat conductive annular portions 422 protrude from the base plate portion 421. The base plate portion 421 is located on a side of the bottom plate 110 facing away from the accommodation space S. As to be explained in detail below, during the rotation of the impeller 200 of the centrifugal fan 10, the heat transfer effect between the heat dissipation part 42 and the impeller 200 of the centrifugal fan 10 that are spaced apart from each other is almost the same as the heat transfer effect between the heat dissipation part and the impeller that are in contact with each other. In this way, the heat generated by the heat source 50 can be effectively transferred to the impeller 200, and heat accumulated in the impeller 200 can be taken away by the airflow produced by the centrifugal fan 10 as well.

The centrifugal fan 10 includes the impeller housing 100 and the impeller 200. The impeller housing 100 has the accommodation space S, an air inlet O1, and the air outlet O2, where the air inlet O1 and the air outlet O2 are connected to the accommodation space S. In more detail, the impeller housing 100 includes a bottom plate 110 and a cover plate 120, the cover plate 120 is disposed on the bottom plate 110 so that the bottom plate 110 and the cover plate 120 together form the accommodation space S and the air outlet O2. In addition, the cover plate 120 forms the air inlet O1.

The impeller 200 is located in the accommodation space S. The impeller 200 includes a hub 210, a plurality of blades 220, and a plurality of heat conductive annular portions 230. The hub 210 is rotatably disposed on the impeller housing 100. The blades 220 are connected to an outer circumferential surface of the hub 210. The heat conductive annular portions 230 are connected to the blades 220. In general, heat transferred between two separated objects is mainly realized by thermal convection; however, since the heat conductive annular portions 230 of the impeller 200 and the heat conductive annular portions 422 of the heat dissipation part 42 are merely spaced apart from each other by a negligible gap, boundary layers formed on the heat conductive annular portions 230 of the impeller 200 and on the heat conductive annular portions 422 of the heat dissipation part 42 would be eliminated during the rotation of the impeller 200 of the centrifugal fan 10. In this way, during the rotation of the impeller 200, the heat transfer effect between the heat conductive annular portions 422 of the heat dissipation part 42 and the heat conductive annular portions 230 of the impeller 200 of the centrifugal fan 10 is almost the same as the heat transfer effect between the heat conductive annular portions that are in contact with each other.

In this embodiment, the heat conductive annular portions 230 are connected to sides of the blades 220 that are located away from the air inlet O1, but the invention is not limited thereto. In other embodiment, the base plate portion of the heat dissipation part can be disposed on a top plate of the impeller housing, and the heat conductive annular portions can be connected to sides of the blades that are located adjacent to the air inlet.

In this embodiment, the heat dissipation annular plate 250 is connected to sides of the heat conductive annular portions 230 that are located adjacent to the air inlet O1 and can enlarge the heat dissipation area of the impeller 200, thereby enhancing the heat dissipation efficiency of the centrifugal fan 10.

In this embodiment, the muffle ring 240 is connected to sides of the blades 220 that are located adjacent to the air inlet O1, but the invention is not limited thereto. In other embodiment, the muffle ring can be connected to sides of the blades that are located away from the air inlet.

In this embodiment, the impeller 200 includes a plurality of heat conductive annular portions 230, but the invention is not limited thereto. In other embodiments, the impeller 200 can only include one heat conductive annular portion 230.

In this embodiment, the muffle ring 240 is connected to sides of the blades 220 that are located away from the hub 210, and that is to say that the muffle ring 240 is connected to ends of the blades 220, but the invention is not limited thereto. In other embodiments, the muffle ring can be connected to central parts of the blades.

In this embodiment, each blade 220 has a recess C located away from the air outlet O2, and the heat conductive annular portions 230 are located in the recesses C.

It is noted that, in other embodiments, the blades may not have the recess C so as to have a larger area for receiving airflow.

Figure 4:
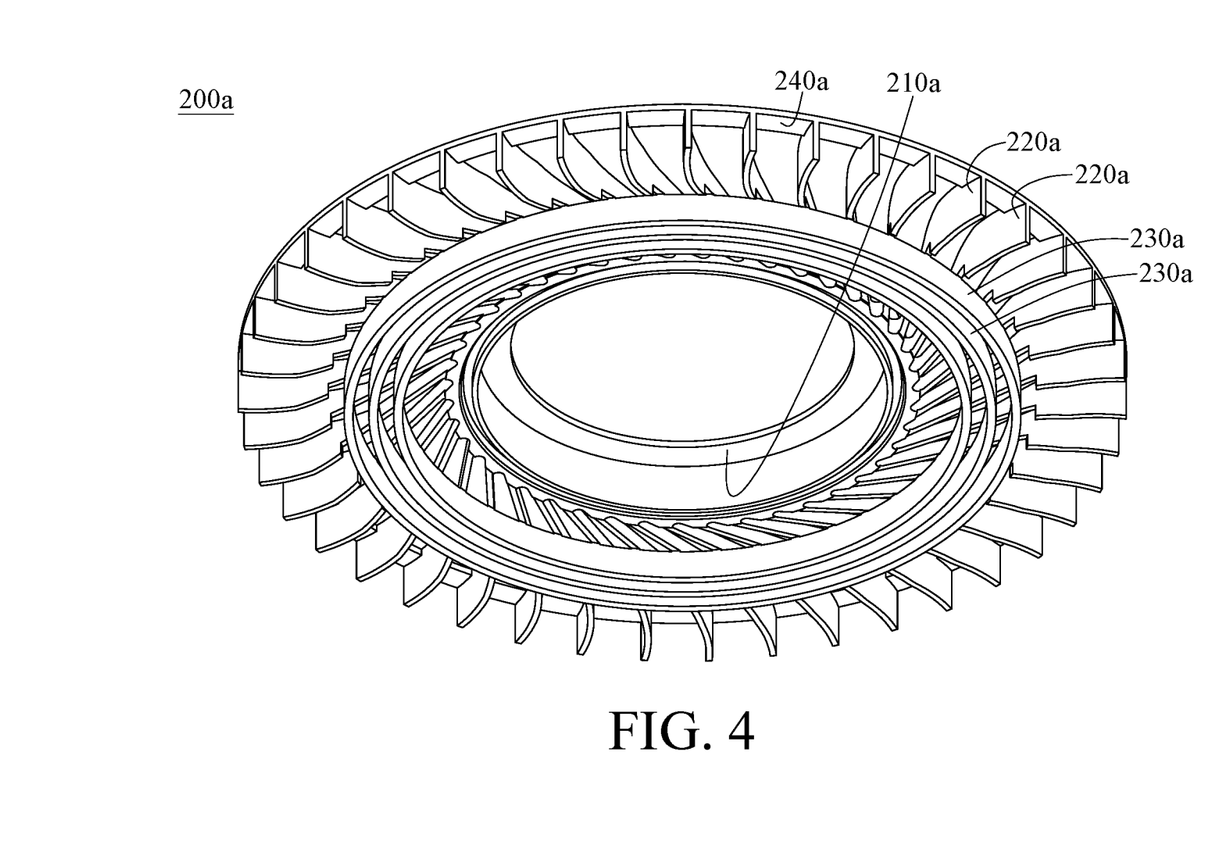
FIG. 4 is a perspective view of an impeller of a centrifugal fan according to a second embodiment of the invention.
Figure 5:
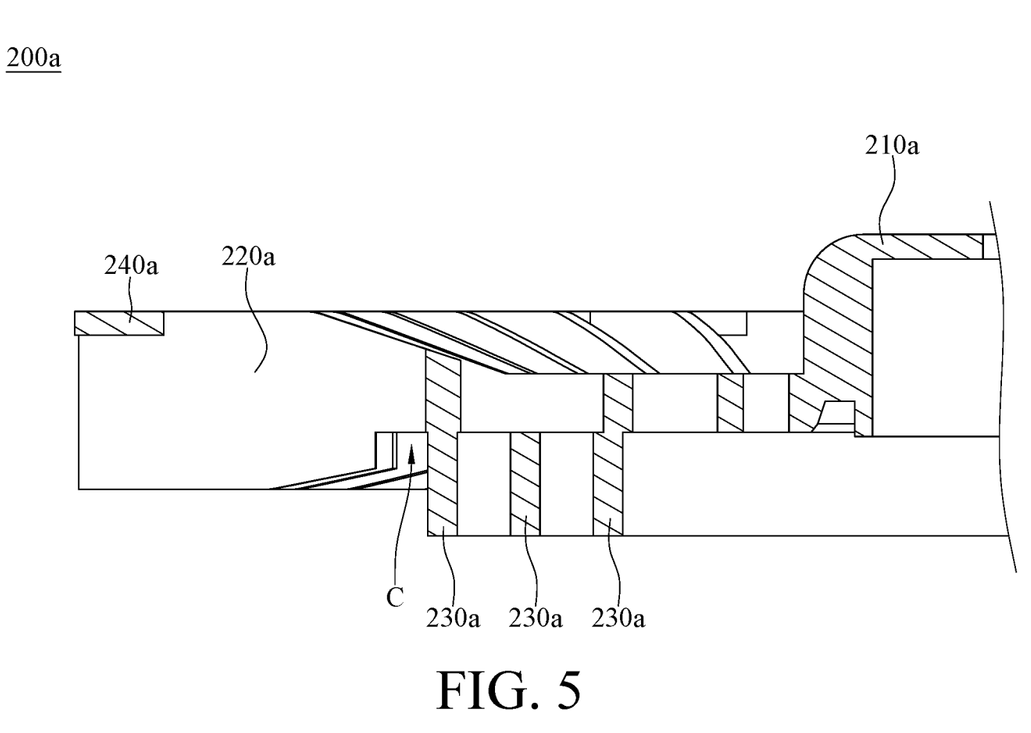
FIG. 5 is a cross-sectional view of the impeller shown in FIG. 4.

In the above embodiment, the impeller 200 of the centrifugal fan 10 includes the heat conductive annular portions 230, the muffle ring 240 and the heat dissipation annular plate 250, but the invention is not limited thereto. Please refer to FIG. 4 and FIG. 5, where FIG. 4 is a perspective view of an impeller of a centrifugal fan according to a second embodiment of the invention, and FIG. 5 is a cross-sectional view of the impeller shown in FIG. 4. In this embodiment, an impeller 200a includes a hub 210a, a plurality of blades 220a, a plurality of heat conductive annular portions 230a and a muffle ring 240a. The blades 220a are connected to an outer circumferential surface of the hub 210a. The heat conductive annular portions 230a are connected to the blades 220a. The muffle ring 240a is connected to sides of the blades 220a that are located adjacent to the air inlet O1. That is, in this embodiment, the impeller 200a includes the heat conductive annular portion 230a and the muffle ring 240a, but does not include the heat dissipation annular plate 250 shown in FIG. 2 and FIG. 3.

Figure 6:
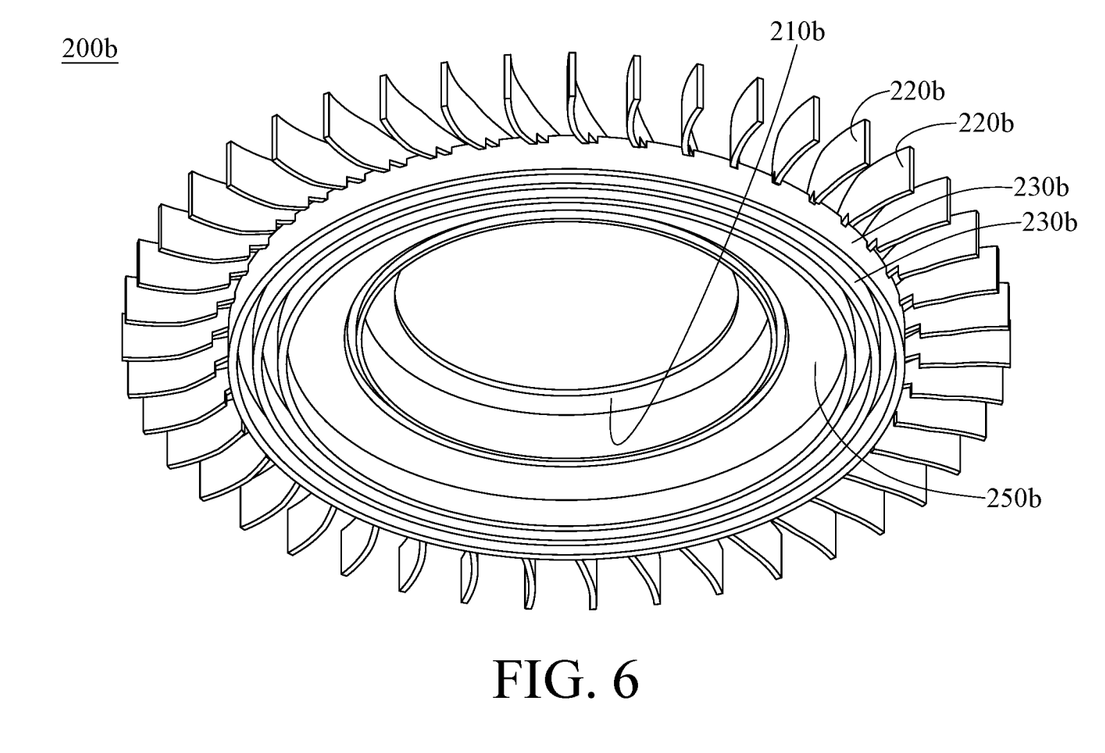
FIG. 6 is a perspective view of an impeller of a centrifugal fan according to a third embodiment of the invention.
Figure 7:
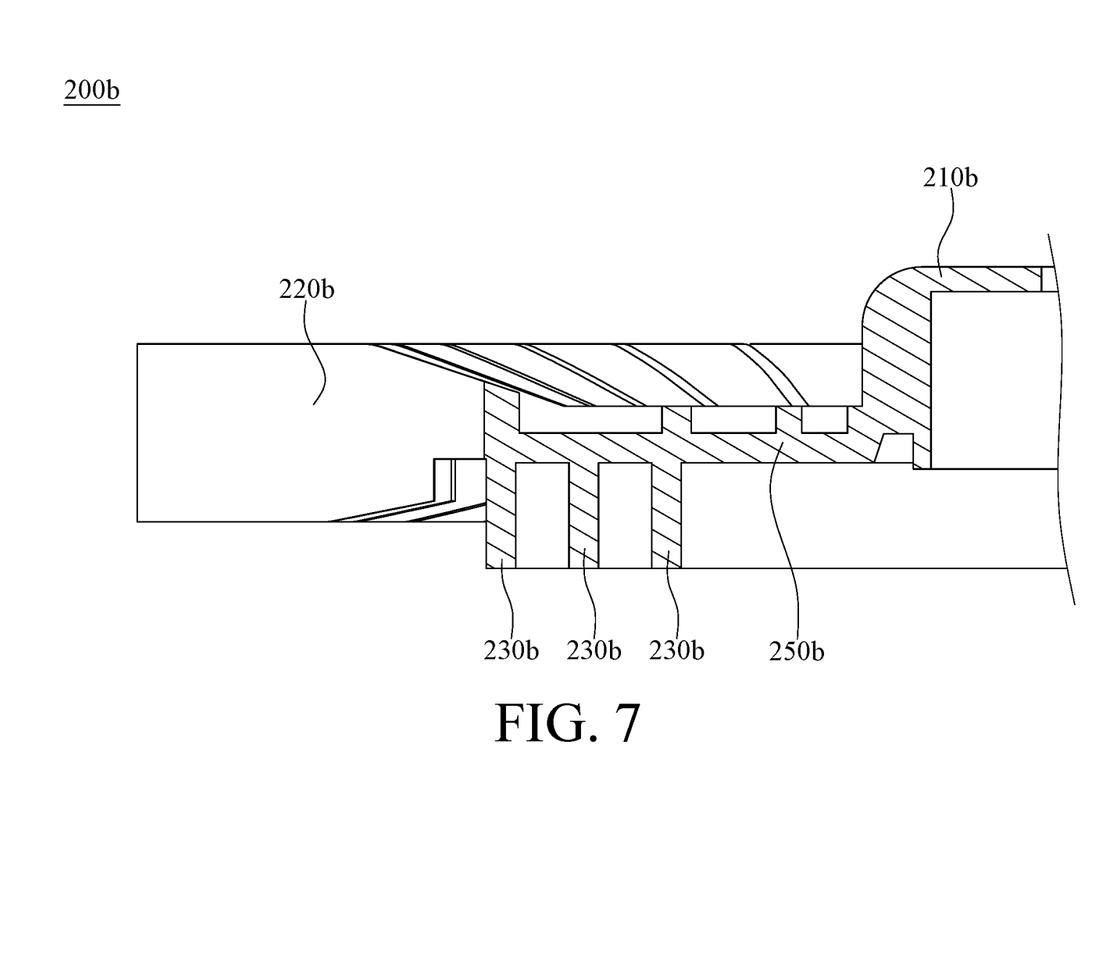
FIG. 7 is a partially enlarged cross-sectional view of the impeller shown in FIG. 6.

Please refer to FIG. 6 and FIG. 7, where FIG. 6 is a perspective view of an impeller of a centrifugal fan according to a third embodiment of the invention, and FIG. 7 is a partially enlarged cross-sectional view of the impeller shown in FIG. 6. In this embodiment, an impeller 200b includes a hub 210b, a plurality of blades 220b, a plurality of heat conductive annular portions 230b and a heat dissipation annular plate 250b. The blades 220b are connected to an outer circumferential surface of the hub 210b. The heat conductive annular portions 230b are connected to the blades 220b. The heat dissipation annular plate 250b is connected to sides of the heat conductive annular portions 230b that are located adjacent to the air inlet O1 and can increase the heat dissipation area of the impeller 200b, thereby enhancing the heat dissipation efficiency of the centrifugal fan 10. That is, in this embodiment, the impeller 200b includes the heat conductive annular portion 230b and the heat dissipation annular plate 250b, but does not include the muffle ring 240 shown in FIG. 2 and FIG. 3.

Figure 8:
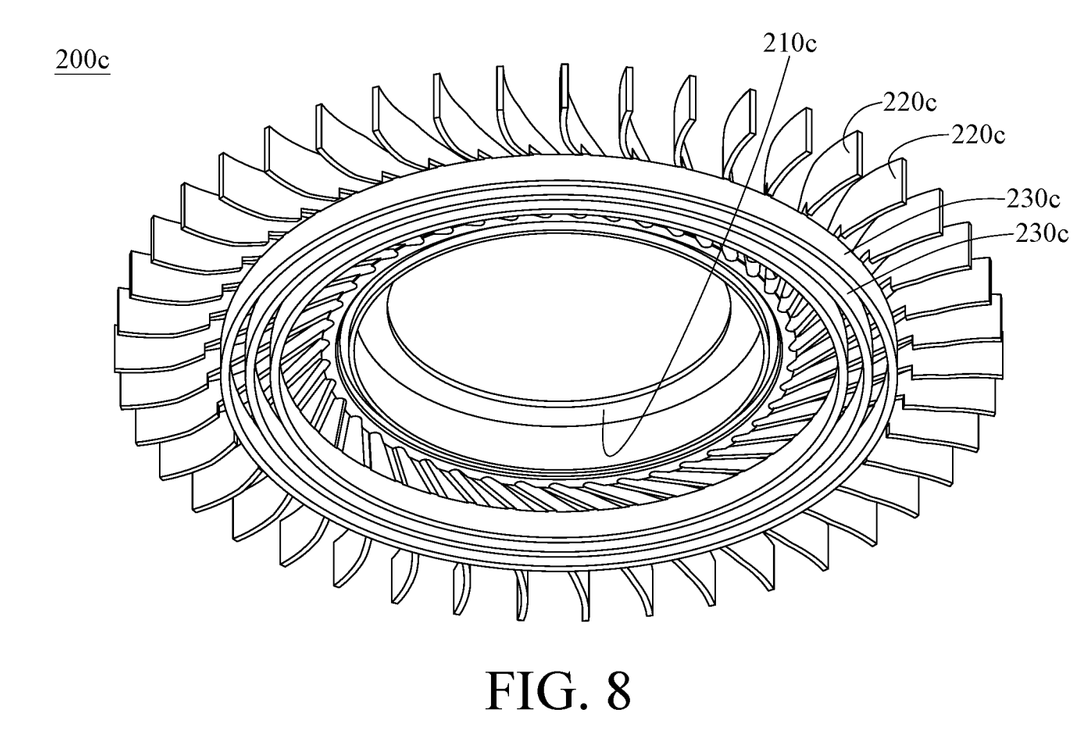
FIG. 8 is a perspective view of an impeller of a centrifugal fan according to a fourth embodiment of the invention.
Figure 9:
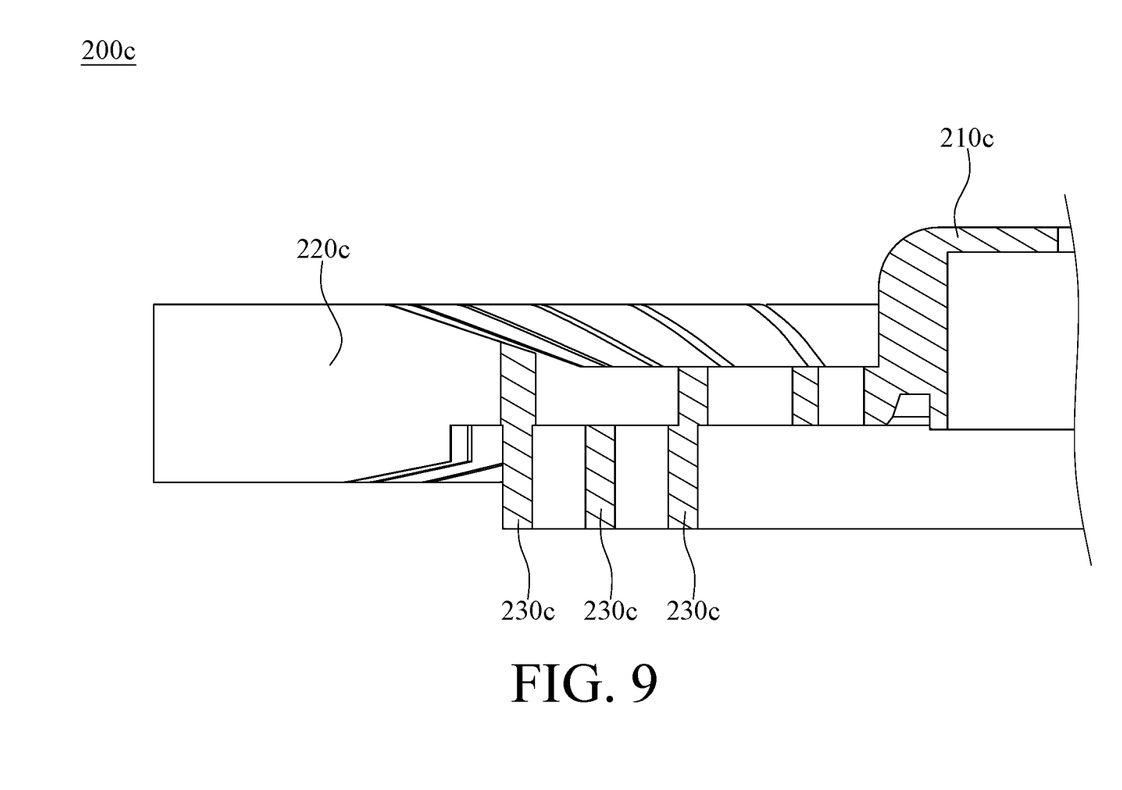
FIG. 9 is a partially enlarged cross-sectional view of the impeller shown in FIG. 8.

Please refer to FIG. 8 and FIG. 9, where FIG. 8 is a perspective view of an impeller of a centrifugal fan according to a fourth embodiment of the invention, and FIG. 9 is a partially enlarged cross-sectional view of the impeller shown in FIG. 8. In this embodiment, an impeller 200c includes a hub 210c, a plurality of blades 220c and a plurality of heat conductive annular portions 230c. The blades 220c are connected to an outer circumferential surface of the hub 210c. The heat conductive annular portions 230c are connected to the blades 220c. That is, in this embodiment, the impeller 200c includes the heat conductive annular portion 230c, but does not include the heat dissipation annular plate 250 and the muffle ring 240 shown in FIG. 2 and FIG. 3.

According to the centrifugal fan discussed above, since the heat conductive annular portions of the impeller and the heat conductive annular portions of the heat dissipation part are merely spaced by a negligible gap, boundary layers formed on the heat conductive annular portions of the impeller and on the heat conductive annular portions of the heat dissipation part would be eliminated during the rotation of the impeller of the centrifugal fan. Therefore, during the rotation of the impeller, the heat transfer effect between the heat conductive annular portions of the heat dissipation part and the heat conductive annular portions of the impeller of the centrifugal fan is almost the same as the heat transfer effect between the heat conductive annular portions that are in contact with each other.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A centrifugal fan, comprising:
   an impeller housing, having an accommodation space, an air inlet and an air outlet, wherein the air inlet and the air outlet are connected to the accommodation space; and
   an impeller, located in the accommodation space, the impeller comprising a hub, a plurality of blades, and at least one heat conductive annular portion, wherein the hub is rotatably disposed in the impeller housing, the plurality of blades are connected to an outer circumferential surface of the hub, and the at least one heat conductive annular portion is connected to the plurality of blades;
   wherein the impeller further comprises a muffle ring, and the muffle ring is connected to sides of the plurality of blades that are located adjacent to the air inlet.

2. The centrifugal fan according to claim 1, wherein the at least one heat conductive annular portion is connected to sides of the plurality of blades that are located away from the air inlet.

3. The centrifugal fan according to claim 2, wherein a quantity of the at least one heat conductive annular portion is plural.

4. The centrifugal fan according to claim 3, wherein the impeller further comprises a heat dissipation annular plate, and the heat dissipation annular plate is connected to sides of the plurality of heat conductive annular portions that are located adjacent to the air inlet.

5. The centrifugal fan according to claim 1, wherein the muffle ring is connected to sides of the plurality of blades that are located away from the hub.

6. The centrifugal fan according to claim 1, wherein each of the plurality of blades has a recess located away from the air outlet, and the at least one heat conductive annular portion is located in the recess.

7. The centrifugal fan according to claim 1, wherein the impeller housing comprises a bottom plate and a cover plate, the cover plate and the bottom plate together form the accommodation space, and the impeller is rotatably disposed on the bottom plate.

\* \* \* \* \*